United States Patent

[19]

Higuchi

[11] Patent Number: 6,018,478

[45] Date of Patent: Jan. 25, 2000

[54] RANDOM ACCESS MEMORY WITH SEPARATE ROW AND COLUMN DESIGNATION CIRCUITS FOR READING AND WRITING

[75] Inventor: Hidekazu Higuchi, Tokyo, Japan

[73] Assignee: NEC Corporation, Tokyo, Japan

[21] Appl. No.: 09/046,620

[22] Filed: Mar. 24, 1998

Related U.S. Application Data

[62] Division of application No. 08/893,568, Jul. 11, 1997, Pat. No. 5,864,505.

[30] Foreign Application Priority Data

Jul. 17, 1996 [JP] Japan .................................... 8-187535

[51] Int. Cl.[7] .................................................. G11C 16/04
[52] U.S. Cl. ............................. 365/189.01; 365/189.04
[58] Field of Search .............................. 365/189.04, 221, 365/189.05, 189.01

[56] References Cited

U.S. PATENT DOCUMENTS 4,807,189 2/1989 Pinkham et al. .

| 4,875,196 | 10/1989 | Spaderna et al. ...................... 365/238 |
| 5,027,326 | 6/1991 | Jones .................................... 365/221 |
| 5,490,257 | 2/1996 | Hoberman et al. ................ 365/189.04 |

FOREIGN PATENT DOCUMENTS

| 62-287498 | 12/1987 | Japan . |
| 1-307996 | 12/1989 | Japan . |
| 2-249195 | 10/1990 | Japan . |
| 4-268288 | 9/1992 | Japan . |
| 4-281287 | 10/1992 | Japan . |
| 5-290573 | 11/1993 | Japan . |

*Primary Examiner*—David Nelms
*Assistant Examiner*—Anh Phung
*Attorney, Agent, or Firm*—Young & Thompson

[57] ABSTRACT

In a random access memory for enabling read operations and write operations to be carried out simultaneously, the memory cell matrix includes separate row address designation circuits for reading and writing and separate column address designation circuits for reading and writing.

1 Claim, 7 Drawing Sheets

RANDOM ACCESS MEMORY WITH SEPARATE ROW AND COLUMN DESIGNATION CIRCUITS FOR READING AND WRITING

CROSS-REFERENCE TO RELATED APPLICATIONS

This application is a division of application Ser. No. 08/893,568, filed Jul. 11, 1997 now U.S. Pat. No. 5,864,505.

BACKGROUND OF THE INVENTION

1. Field of the Invention

The present invention relates to a semiconductor memory, and in particular to a random access memory.

2. Description of the Related Art

Conventionally, the control of reading and writing in a random access memory has generally been limited to either a read mode or write mode for each cycle, and as a mode for carrying out reading and writing within the same time period, either "read-modify-write" or a dual-port random access memory using serial ports has been employed.

FIG. 1 is a block diagram showing a random access memory of the prior art, and FIG. 2 is a "read-modify-write" timing chart for the random access memory shown in FIG. 1.

As external inputs, a random access memory includes power pins (VDD and GND), a row address strobe signal pin 51 (/RAS), a column address strobe signal pin 52 (/CAS), a plurality of address pins 53, write enable signal pin 54 (/WE), output enable signal pin 55 (/OE), data input pin 56 (DIN), and data output pin 57 (DOUT); these pins determining operation modes and effecting input and output of data. The internal circuits are mainly composed of memory cell matrix 61, address judgment circuit 62, row address designation circuit 63, column address designation circuit 64, read/write control circuit 65, input data buffer circuit 66, and output data buffer circuit 67. Here, the slash included in labels such as "/RAS" indicates activation at low level.

The read-modify-write operation in the random access memory shown in FIG. 1 will next be explained with reference to FIG. 2.

When row address strobe signal pin 51 becomes active at time $t_1$, the data of outside address signal 53 at this time is taken in by address judgment circuit 62, and a row address is designated by row address designation circuit 63. When column address strobe signal pin becomes active at time $t_2$, the data of outside address signal 53 at this time is taken into address judgment circuit 62 in the same way as for the row, and a column address is designated by column address designation circuit 64.

In the case of a read-modify-write operation, the enabling of output enable signal/OE at this point in time $t_2$ causes the data of the memory cell designated by the row and column addresses to pass through the input/output bus 68 and be outputted by way of data output pin 57. The subsequent enabling of write enable signal/WE designates a write operation, which in turn causes the data of data input pin 56 to be taken in by input buffer circuit 66 and written to the memory cell of the address designated from input/output bus 68. On the other hand, output buffer circuit 67 activates read/write control signal 65 and halts the output of output data.

FIG. 3 is a block diagram of a dual-port random access memory of the prior art, and FIG. 4 is a timing chart of the dual-port random access memory shown in FIG. 3.

As shown in FIG. 3, the dual-port random access memory is provided with, in addition to an ordinary random access memory, serial port read/write control circuit 72, serial port enable signal 73 (/SE) as outside input, serial port clock signal pin 74 (/SC), serial port data input/output pin 71 (SIO), and serial port data storage buffer circuit 75. These components determine the mode of operation and effect the input and output of data.

The operation of the dual-port random access memory will next be described with reference to FIG. 4.

As for the random access unit described hereinabove, when row address strobe signal pin 51 is activated at time t1, the data of outside address signal 53 at this time is taken into address judgment circuit 62 and a row address is designated by row address designation circuit 63. When column address strobe signal pin 52 becomes active at time $t_2$, the data of outside address signal 53 at this time is taken into address judgment circuit 62 in the same way as for the row and a column address is designated by column address designation circuit 64.

In the case of a dual-port random access memory, the enabling of outside signal SE at time $t_1$ enables the serial port, and the data of the memory cell designated by the row and column addresses are sent bit by bit from serial port input/output pin 71 to serial port data storage buffer circuit 75 during the activation of serial port clock signal 72; while in the case of a serial-read operation, the data of the memory cell designated by the row and column addresses are sent to data storage buffer circuit 75 and outputted bit by bit from serial data input/output pin 71 during the activation of serial port clock signal 72. By providing serial port data storage buffer circuit 75 and storing data in this buffer, data can be transferred using serial port input/output pin 71 asynchronously with the random access section, thereby making it possible to write in the serial port section while reading in the random access section, or to read in the serial port section while writing in the random access section.

In the case of a read-modify-write operation, after ending a normal read operation and outputting data from a memory cell from the output pin, a write operation is performed and new data are written to the same address. However, not only does this operation entail the time for the read operation and write operation in addition to the time for determining address, but the permissible address for a read operation and write operation during the same time period is limited to the same address.

On the other hand, when effecting a read operation and write operation simultaneously by a dual-port random access memory during the same time period, either data of a memory cell are temporarily stored in a serial port data storage buffer of the serial port section by data transfer, or stored data are transferred to a memory cell in a data transfer cycle, and this not only complicates a simultaneous read operation and write operation to any address, but also prevents a read operation or write operation during the same time period in page mode using the serial port section.

SUMMARY OF THE INVENTION

The object of the present invention is to provide a random access memory that allows a read operation and write operation at the same time.

In the random access memory of the present invention, the memory cell matrix is divided into a plurality of banks, each bank having a write enable signal line, an output enable signal line, a data input/output line, a row address designation circuit, a column address designation circuit, a read/ write control circuit, an input data buffer circuit, and an output data buffer circuit.

Because independent control of either a read operation or write operation is possible for each bank, read operations and write operations can be effected for a plurality of addresses during the same time period.

Another random access memory according to the present invention includes separate row address designation circuits and column address designation circuits for read use and write use.

As a result, the input/output data bus includes a reading portion and a writing portion, and during the same time period, can include a mode that selects any read operation address, activates a read operation Y switch (output from the column address designation circuit to the memory cell), and effects a read operation, as well as a mode that selects any write operation address, activates a write operation Y switch, and effects a write operation. This type of construction is possible because, in a custom LSI for which a random access memory section makes up the core, the input/output portion of the random access memory section is divided.

The present invention enables simultaneous writing of data to a memory cell and reading of data from a memory cell in the same time period as the cycle time required for a single write or read operation to differing addresses during tie same cycle; thereby allowing a reduction of the total cycle time when using a write operation and read operation in parallel, thus allowing a simplification of the timing control of write enable signals and output enable signals, and enabling more efficient use of a memory.

The above and other objects, features, and advantages of the present invention will become apparent from the following description without references to the accompanying drawings which illustrate examples of the present invention.

DETAILED DESCRIPTION OF THE PREFERRED EMBODIMENTS

Figure 1:
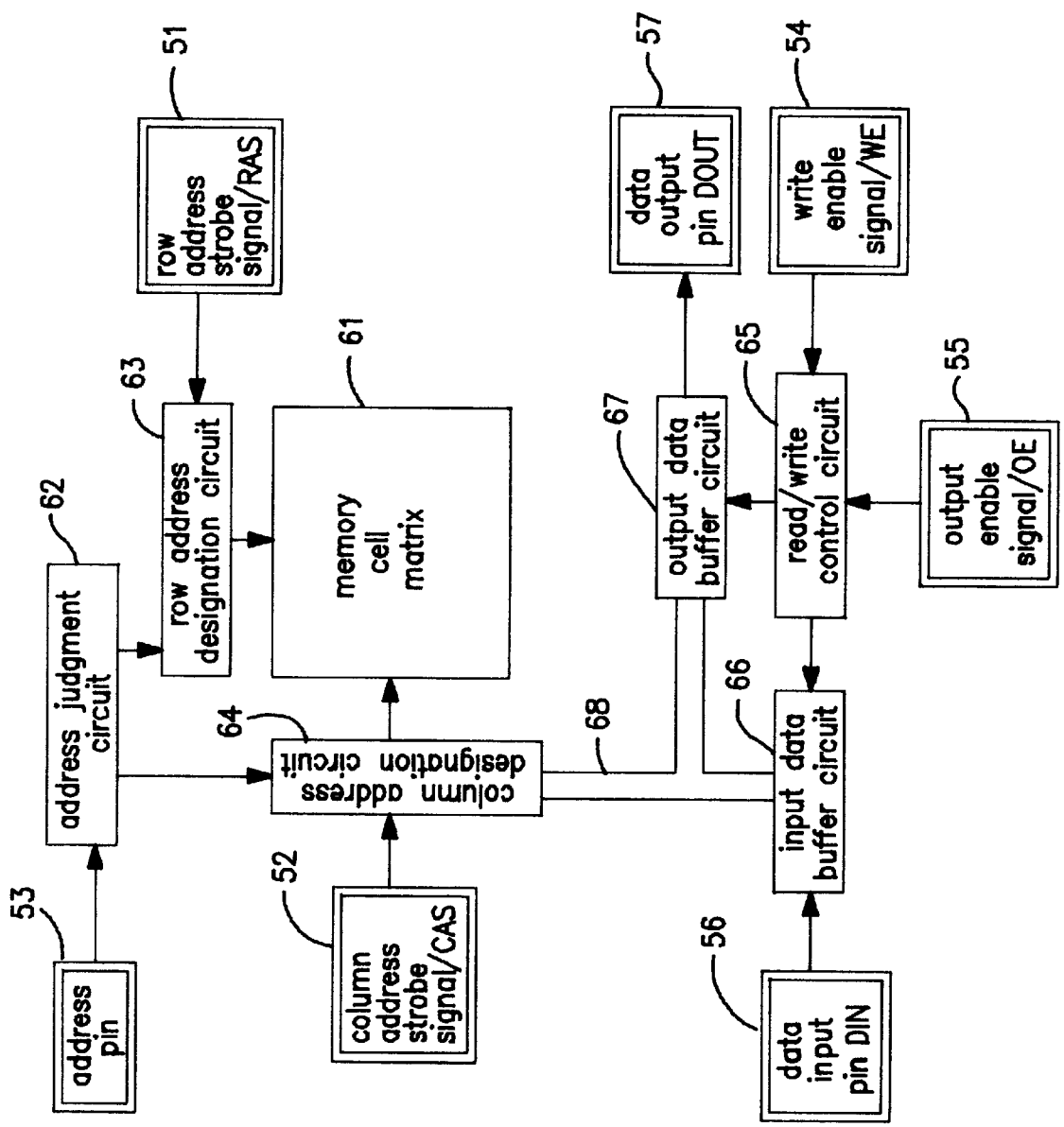
FIG. 1 is a block diagram of a random access memory of the prior art.
Figure 2:
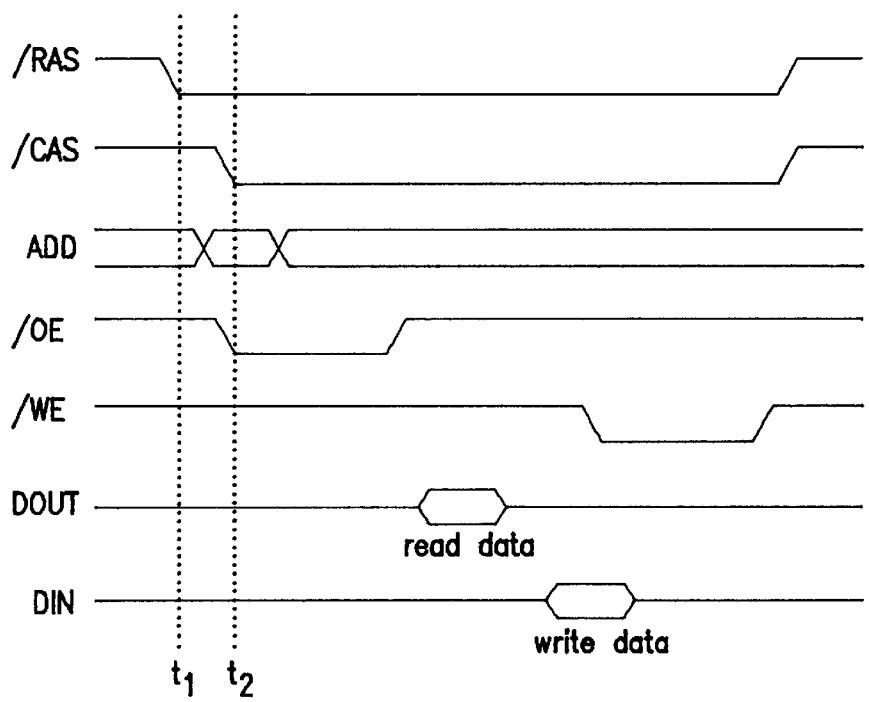
FIG. 2 is a timing chart for the random access memory of FIG. 1.
Figure 3:
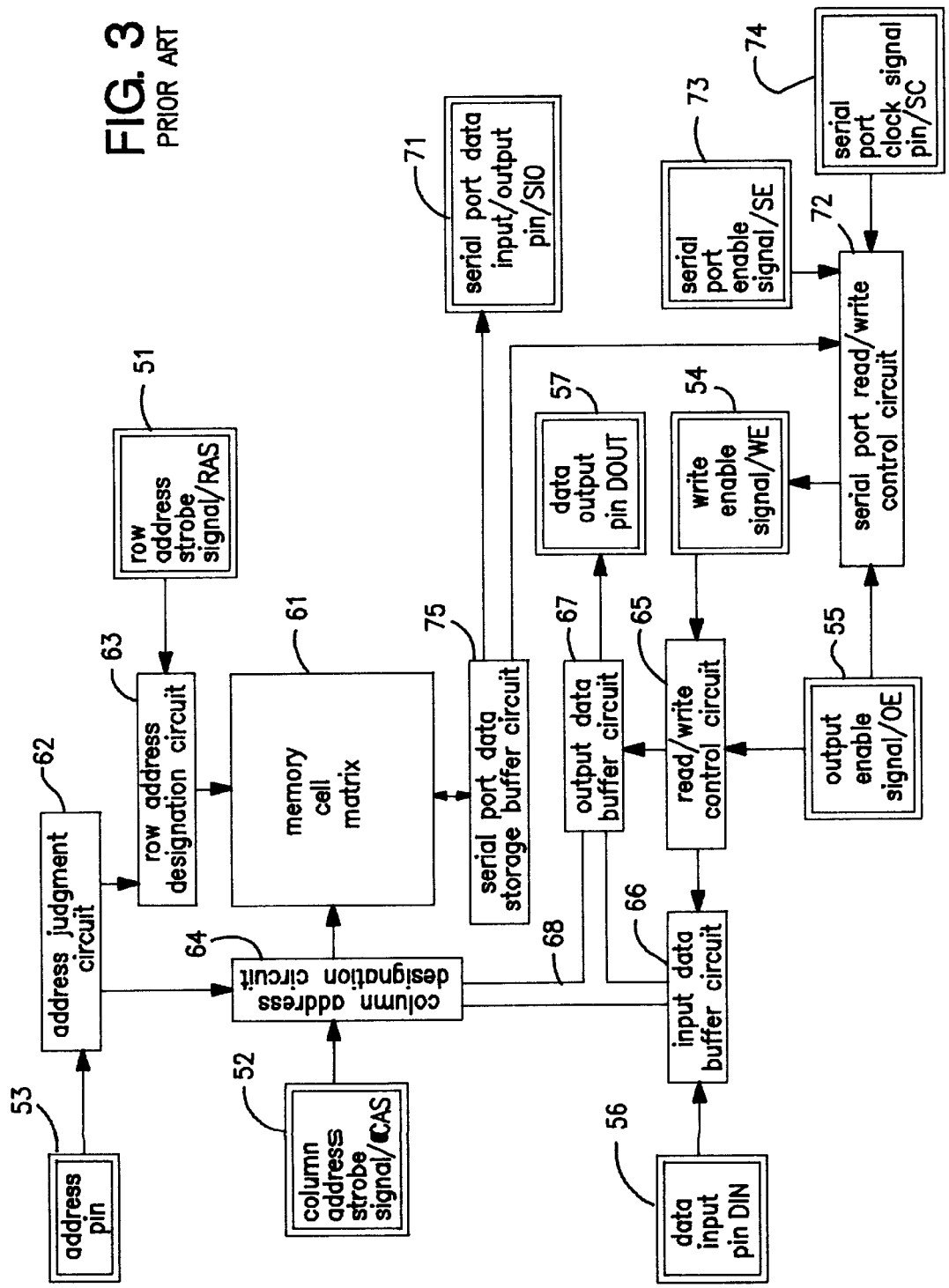
FIG. 3 is a block diagram showing a dual port random access memory of the prior art.
Figure 4:
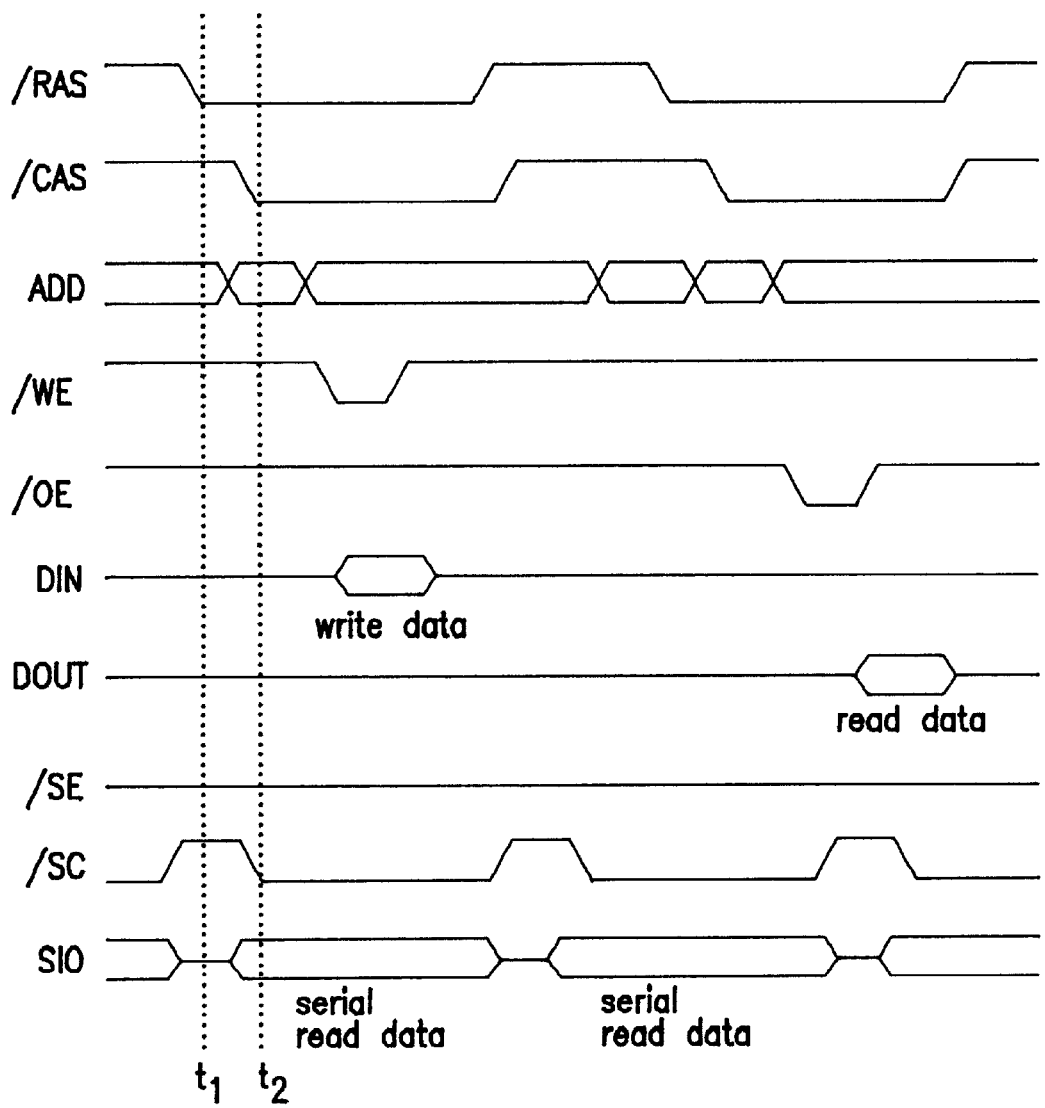
FIG. 4 is a timing chart for the dual port random access memory of FIG. 3.
Figure 5:
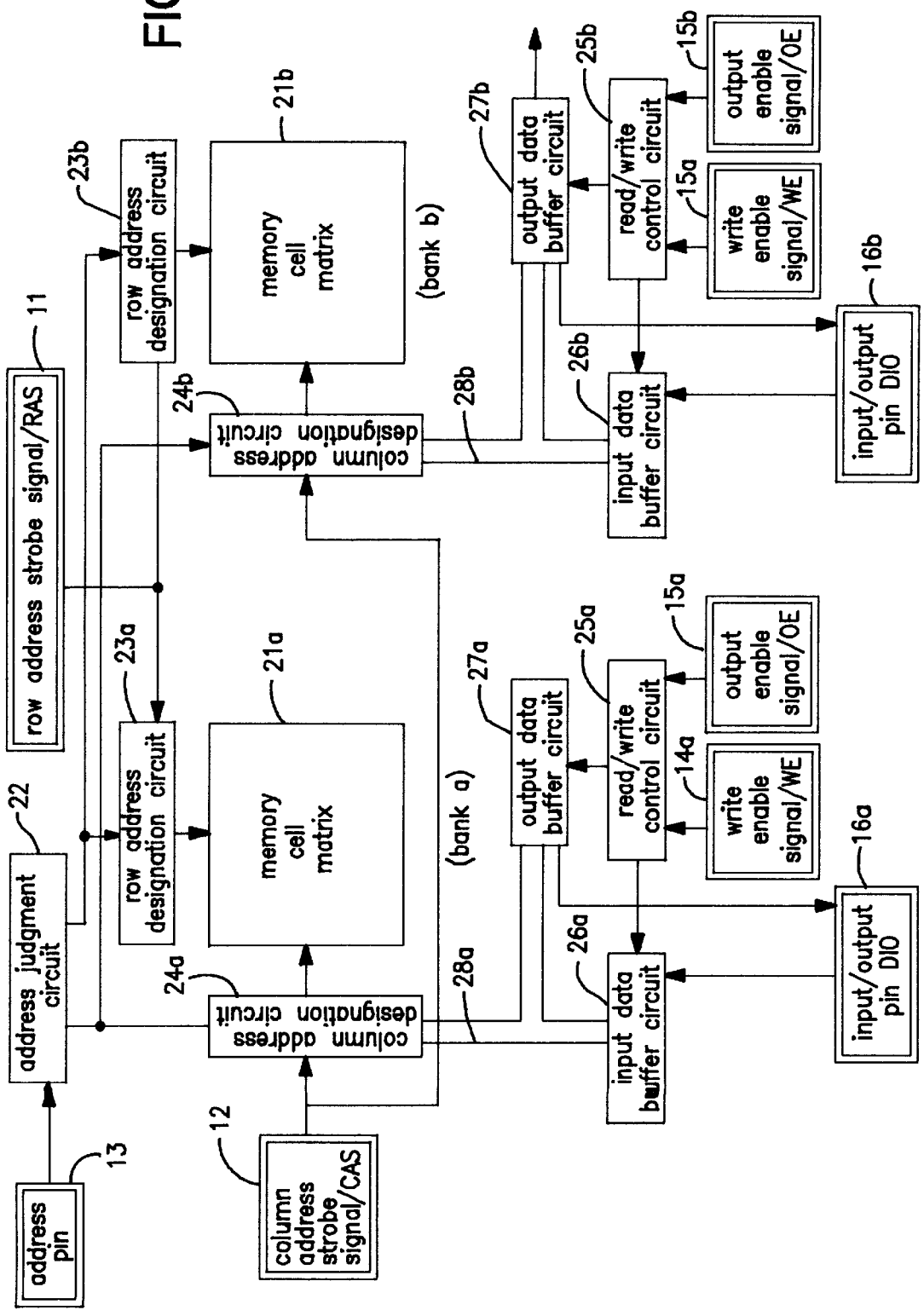
FIG. 5 is a block diagram showing a semiconductor memory according to the first embodiment of the present invention.

The random access memory according to the first embodiment of the present invention shown in FIG. 5 has a memory cell that is divided between two banks a and b, and, similarly to the random access memory of the prior art shown in FIG. 1 and FIG. 3, includes power supply pins (VDD and GND) as outside input, row address strobe signal pin 11 (/RAS), column address strobe signal pin 12 (/CAS), a plurality of address pins 13, a write enable signal pin 14a and 14b (/WE) for each bank, an output enable signal pin 15a and 15b (/OE) for each bank, and a data input/output pin 16a and 16b (DIO) provided as one pin for data input and output for each bank; and its internal circuits are composed of a memory cell matrix 21a and 21b for each bank, address judgment circuit 22, a row address designation circuit 23a and 23b for each bank, a column address designation circuit 24a and 24b for each bank, a read/write control circuit 25a and 25b for each bank, an input data buffer circuit 26a and 26b for each bank, and an output data buffer circuit 27a and 27b for each bank.

The operation of this embodiment will next be explained with reference to the timing chart shown in FIG. 6.

Figure 6:
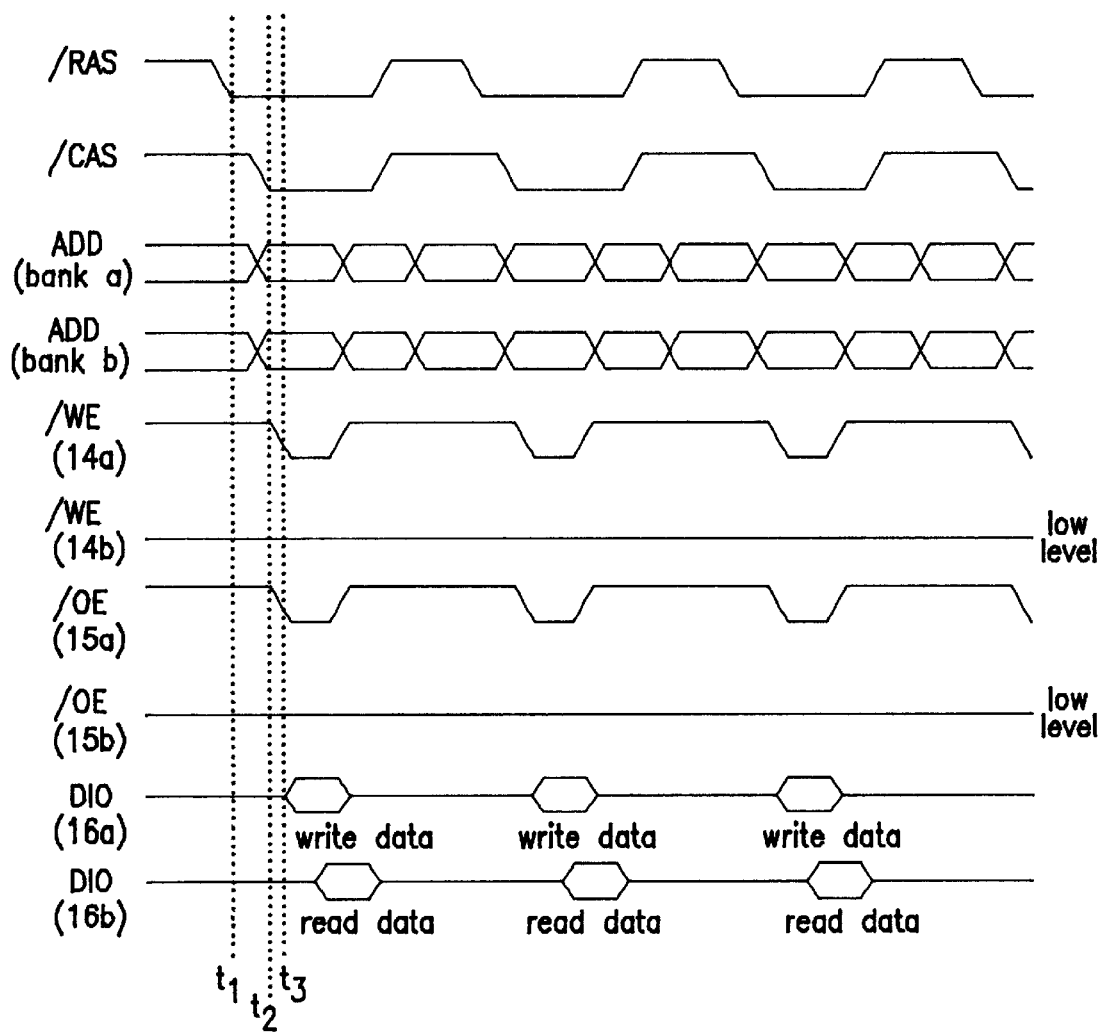
FIG. 6 is a timing chart of the semiconductor memory of FIG. 5.

The designation of row address and column address is effected as in the prior art, and in the example shown in FIG. 6, data are outputted from a memory cell in input/output bus 28b. At time $t_1$, the row address strobe signal 11 is designated for each bank, and the data of outside address signal 13 are taken into row address designation circuits 23a and 23b as row address designation; and at time $t_2$, the column address strobe signals 12 are designated for each bank, and the data of outside address signal 13 are taken into column address designation circuits 24a and 24b as the column address designation.

At time $t_3$, through a write operation on the bank a side and a read operation on the bank b side, data inputted to input/output pin 16a (DIO) are written to designated address 21a after passing through input buffer circuit 26a and input/output bus 28a, and data read from cell matrix 21b of the designated address are outputted from input/output bus 28b to input/output pin 16b (DIO) by way of output buffer circuit 27b.

Figure 7:
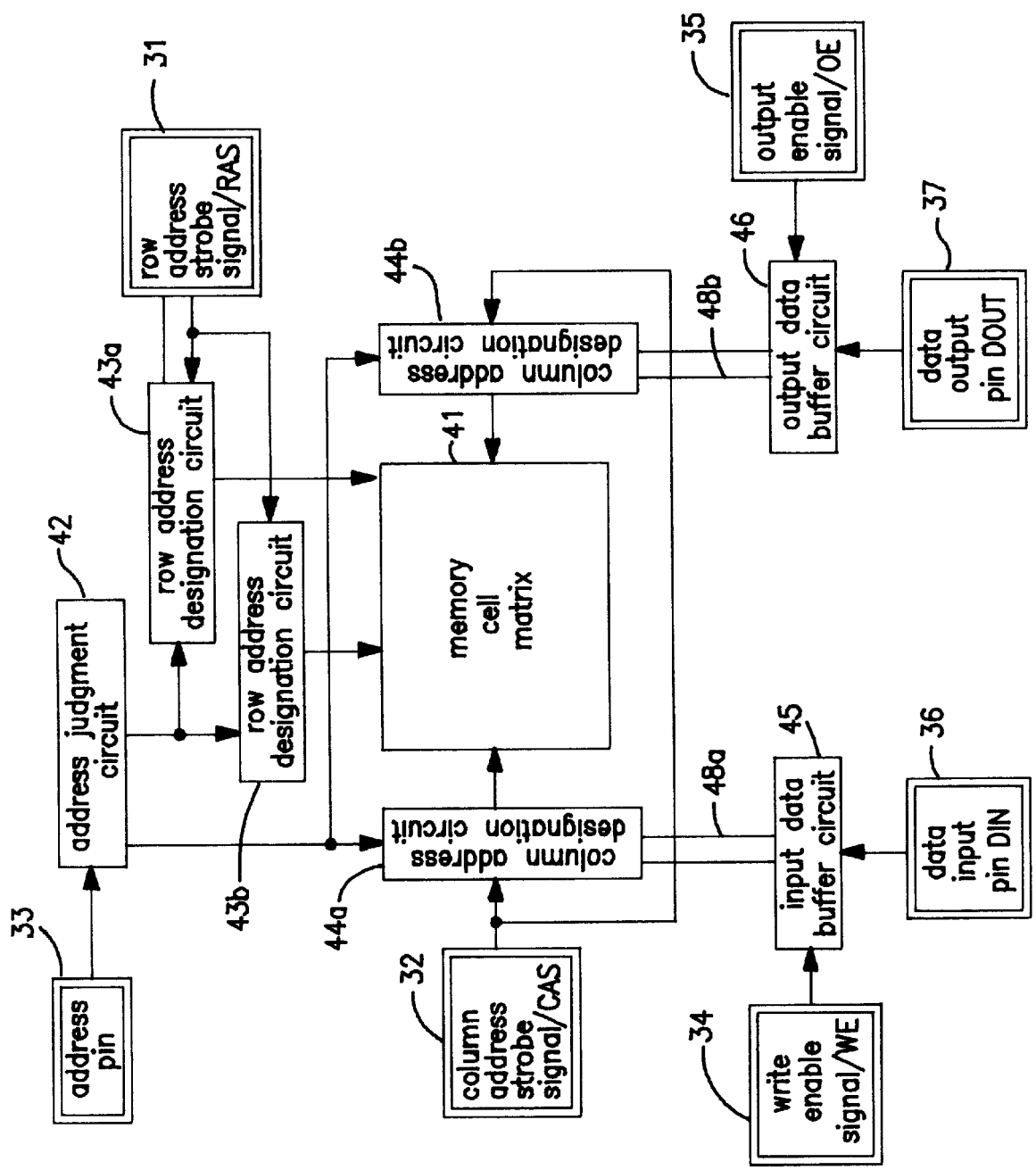
FIG. 7 is a block diagram showing a semiconductor memory according to the second embodiment of the present invention.

The random access memory according to the second embodiment of the present invention shown in FIG. 7 includes, instead of the bank division of the first embodiment, entirely separate read and write components from row addresses and column addresses to data buffer circuits and input/output circuits, and includes power supply pin (VDD and GND) as outside input, row address strobe signal pin 31 (/RAS), column address strobe signal pin 32 (/CAS), a plurality of address pins 33, write enable signal pin 34 (/WE), output enable signal pin 35 (/OE), data input pin 36 (DIN), and data output pin 37 (DOUT); while the internal circuits are composed of, according to a form in which one memory matrix 41 is divided between reading and writing, address judgment circuit 42, row address designation circuit 43a for writing and row address designation circuit 43b for reading, column address designation circuit 44a for writing and column address designation circuit 44b for reading, write bus 48a and read bus 48b, input buffer circuit 45, and output buffer circuit 46.

Figure 8:
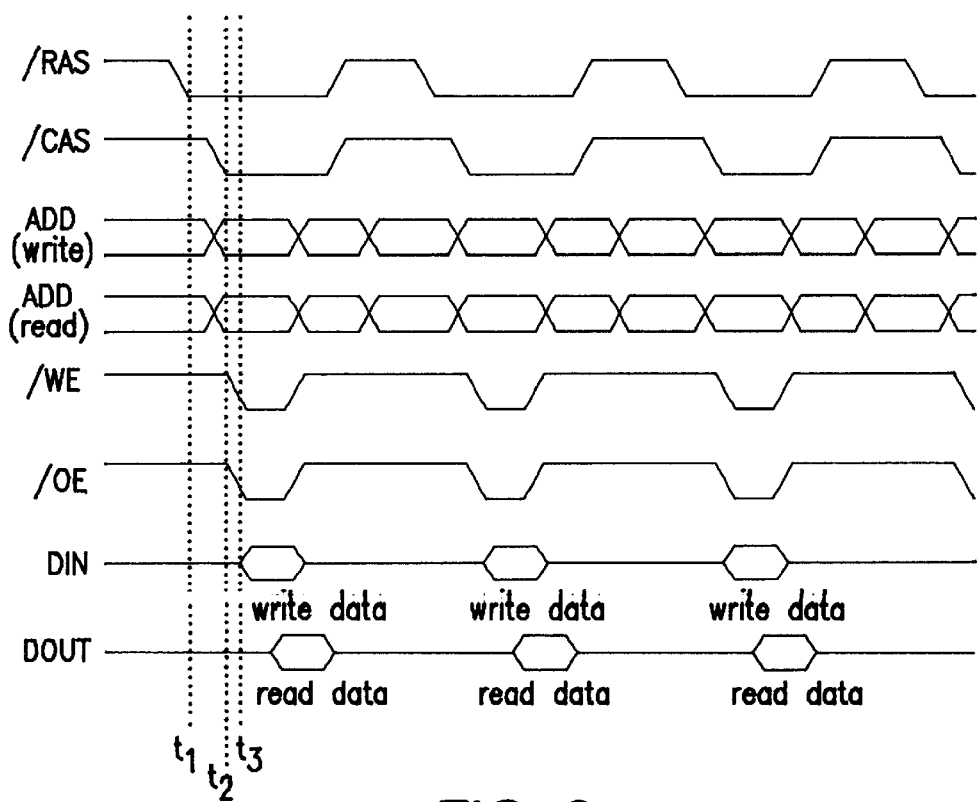
FIG. 8 is a timing chart for the semiconductor memory of FIG. 7.

The operation of this embodiment will next be described with reference to the timing chart of FIG. 8.

In input bus 48a, data from input pin 36 are sent to memory cell matrix 41 by way of input buffer circuit 45, and in output bus 48b, data from memory cell matrix 41 are sent by way of output buffer circuit 46 and outputted from output pin 37, the designation of row addresses and column addresses being equivalent to the prior-art example and the timing being the same as in FIG. 6 of the first embodiment.

At time $t_1$, row address strobe signals 31 are designated for write use and read use, following which the data of outside address signal 33 are taken into row address designation circuits 43a and 43b as the row address designation; and at time $t_2$, column address strobe signals 32 are designated for write use and read use, following which the data of outside address signal 33 are taken into column address designation circuits 44a and 44b as the column address designation.

The memory according to this invention enables a write operation and read operation during the same time period by dividing into banks and providing a write enable signal pin and an output enable signal pin for each bank as in the first embodiment, or by dividing components between write use and read use from the address designation circuits to the data bus, input/output buffer, and outside input/output pin as in the second embodiment, and in contrast with "read-modify-write," allows reading and writing to differing addresses during the same time period rather than reading and writing to the same address during the same time period, and as a result, when used as a simultaneous write/read operation memory, this memory allows a cycle time with the same minimum cycle as for a single write or read operation time, arid is useful for increasing the write/read data transfer speed of a memory.

While preferred embodiments of the present invention have been described using specific terms, such description is for illustrative purposes only, and it is to be understood that changes and variations may be made without departing from the spirit or scope of the following claims.

What is claimed is:

1. A random access memory comprising a first unitary memory cell matrix that is operable without reference to a companion memory cell matrix, a first row address designation circuit connected to said first memory cell matrix for reading operations and a second row address designation circuit, separate from said first row address designation circuit and also connected to said first memory cell matrix, for writing operations, a first column address designation circuit connected to said first memory cell matrix for reading operations and a second column address designation circuit, separate from said first column address designation circuit and also connected to said first memory cell matrix, for writing operations, an output buffer circuit connected to said first column address designation circuit, and an input buffer circuit connected to said second column address designation circuit.

* * * * *